(12) United States Patent
Wang et al.

(10) Patent No.: US 10,867,999 B2
(45) Date of Patent: Dec. 15, 2020

(54) SEMICONDUCTOR DEVICE AND METHOD OF FORMING THE SAME

(71) Applicant: UNITED MICROELECTRONICS CORP., Hsin-Chu (TW)

(72) Inventors: Meng-Chiang Wang, Tainan (TW); Yi-Chung Sheng, Tainan (TW); Sheng-Yuan Hsueh, Tainan (TW); Kuo-Hsing Lee, Hisinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 64 days.

(21) Appl. No.: 16/203,617

(22) Filed: Nov. 29, 2018

(65) Prior Publication Data
US 2020/0126978 A1   Apr. 23, 2020

(30) Foreign Application Priority Data
Oct. 18, 2018   (TW) .............................. 107136747 A

(51) Int. Cl.
| | |
|---|---|
| *H01L 27/088* | (2006.01) |
| *H01L 21/8234* | (2006.01) |
| *H01L 29/06* | (2006.01) |
| *H01L 29/66* | (2006.01) |
| *H01L 29/78* | (2006.01) |

(52) U.S. Cl.
CPC .. *H01L 27/0886* (2013.01); *H01L 21/823431* (2013.01); *H01L 21/823437* (2013.01); *H01L 21/823481* (2013.01); *H01L 29/0642* (2013.01); *H01L 29/0696* (2013.01); *H01L 29/66606* (2013.01); *H01L 29/7851* (2013.01)

(58) Field of Classification Search
CPC ..... H01L 21/823431; H01L 21/823821; H01L 21/845; H01L 27/0886; H01L 27/0924; H01L 27/10826; H01L 27/10879; H01L 27/1211; H01L 29/41791; H01L 29/66795; H01L 29/66545; H01L 29/66606; H01L 29/6681; H01L 29/7831; H01L 29/785
See application file for complete search history.

(56) References Cited

U.S. PATENT DOCUMENTS

| | | |
|---|---|---|
| 2007/0221957 A1 | 9/2007 | Kitajima et al. |
| 2013/0228866 A1 | 9/2013 | Lee et al. |
| 2016/0155739 A1* | 6/2016 | Ting ................ H01L 21/82348 257/401 |
| 2016/0343709 A1* | 11/2016 | Kim .................... H01L 29/0653 |
| 2017/0012000 A1* | 1/2017 | Tseng ................... H01L 23/535 |
| 2017/0194436 A1* | 7/2017 | Basker ................ H01L 29/0657 |
| 2018/0130711 A1* | 5/2018 | Zang ............... H01L 21/823431 |
| 2018/0331225 A1* | 11/2018 | Liaw ................ H01L 21/76831 |
| 2019/0067120 A1* | 2/2019 | Ching ............... H01L 29/66545 |

* cited by examiner

*Primary Examiner* — David C Spalla
(74) *Attorney, Agent, or Firm* — Winston Hsu

(57) ABSTRACT

A semiconductor device and a method of forming the same, the semiconductor device includes a substrate, a first well and a first dummy cell region. The substrate has a plurality fins disposed therein, and the fins are extended along a first direction. The first well is disposed in the substrate, and a dummy cell region is disposed at a first boundary of the first well. The first dummy cell region includes a first isolation structure and a plurality of first gate structures. The first SDB is disposed in the substrate, along a second direction perpendicular to the first direction to penetrate through one of the fins, and the first gate structures are disposed over the first SDB.

20 Claims, 6 Drawing Sheets

US 10,867,999 B2

SEMICONDUCTOR DEVICE AND METHOD OF FORMING THE SAME

BACKGROUND OF THE INVENTION

1. Field of the Invention

The present invention generally relates to the field of a semiconductor device and a method of forming the same, and more particularly to a semiconductor device having a dummy structure and a method of forming the same.

2. Description of the Prior Art

In semiconductor processing, dummy patterns have been used in diffusion mask and/or gate layer to prevent dishing effects from chemical-mechanical polishing (CMP) and to minimize the effects of device-to-device variations in pattern density. Accordingly, a shallow trench isolation structure (STI structure) is provided thereby to apply to deep sub-micron process. The formation of the shallow trench isolation structure involves etching of trenches patterns into a semiconductor substrate and subsequently filling the trenches with an insulating material. The insulating material is then planarized by using a process such as a CMP or an etch back process, to form an insulating region for isolating elements for achieving advantages like similar pattern densities, clearly division of active areas, uniform isolation depth and scalable dimensions. Thus, the shallow trench isolation structure has been a currently idea isolation technique and which has been widely used in integrate circuit processing.

However, as feature sizes are decreased by the complexity of currently integrated circuits to improve the performance of the metal oxide half-field effect transistor, the existing processes have met its bottleneck in currently lithography techniques and the highly cost thereof. Therefore, the current setting of the dummy pattern needs to be further improved to meet the expectations.

SUMMARY OF THE INVENTION

One object of the present invention is to provide a semiconductor device and a method of forming the same, in which, a dummy cell region is directly disposed on a boundary of a core region to cross the boundary of the core region, so as to reduce the density difference between each component pattern of the semiconductor device, and also to improve the unstable current issue.

To achieve the purpose described above, the present invention provides a semiconductor device including a substrate, a first well and a first dummy cell region. The substrate has a plurality fins disposed in the substrate, with the fins being extended along a first direction. The first well is disposed in the substrate, and the first dummy cell region is disposed at a first boundary of the first well. The first dummy cell region includes a first isolation structure and a plurality of first gate structures. The first isolation structure is disposed in the substrate, along a second direction being perpendicular to the first direction to penetrate through one of the fins, the first gate structure are disposed on the first isolation structure.

To achieve the purpose described above, the present invention provides a method of forming a semiconductor device including the following steps. First of all, a substrate is provided, and a first layout pattern is used to form a first well in the substrate. Then, a second layout pattern is used to form a first isolation structure and a second isolation structure in the substrate. The first isolation structure overlaps a first boundary of the first well in a first direction, and the second isolation structure overlaps a second boundary of the first well in a second direction being perpendicular to the first direction. Next, a third layout pattern is used to form a plurality of gate structures along the first direction on the substrate.

In summary, the semiconductor device of the present invention disposes at least one dummy cell region on a boundary of a core region, to make the dummy cell region to partially overlap with the core region. In this way, the requested disposing area of the dummy cell region in the semiconductor device is sufficiently shrunk, while maintaining the overall component density of the semiconductor device. Furthermore, the dummy cell region includes an isolation structure which is additionally disposed across the boundary of the core region to overlap with the boundary, with the disposition of the isolation structure improving possible current leakage or unstable current issues occurred at the boundary of the core region. The isolation structure has an extended length on the boundary which is entirely extended over the length of a main element in the core region, so as to achieve a better isolation.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 2 are schematic diagrams illustrating a structure of a semiconductor device according to a first preferred embodiment of the present invention, in which:

FIG. 1 shows a top view of a semiconductor device; and
FIG. 2 shows a cross-sectional view taken along a cross line A-A' in FIG. 1.

FIG. 3 to FIG. 4 are schematic diagrams illustrating a structure of a semiconductor device according to a second preferred embodiment of the present invention, in which:

FIG. 3 shows a top view of a semiconductor device; and
FIG. 4 shows a cross-sectional view taken along a cross line B-B' in FIG. 3.

FIG. 8 to FIG. 9 are schematic diagrams illustrating a structure of a semiconductor device according to a third preferred embodiment of the present invention, in which:

FIG. 8 shows a top view of a semiconductor device; and
FIG. 9 shows cross-sectional views taken along cross lines C-C' and D-D' in FIG. 8.

DETAILED DESCRIPTION

To provide a better understanding of the present invention, preferred embodiments will be described in detail. The preferred embodiments of the present invention are illustrated in the accompanying drawings with numbered elements.

Figure 1:
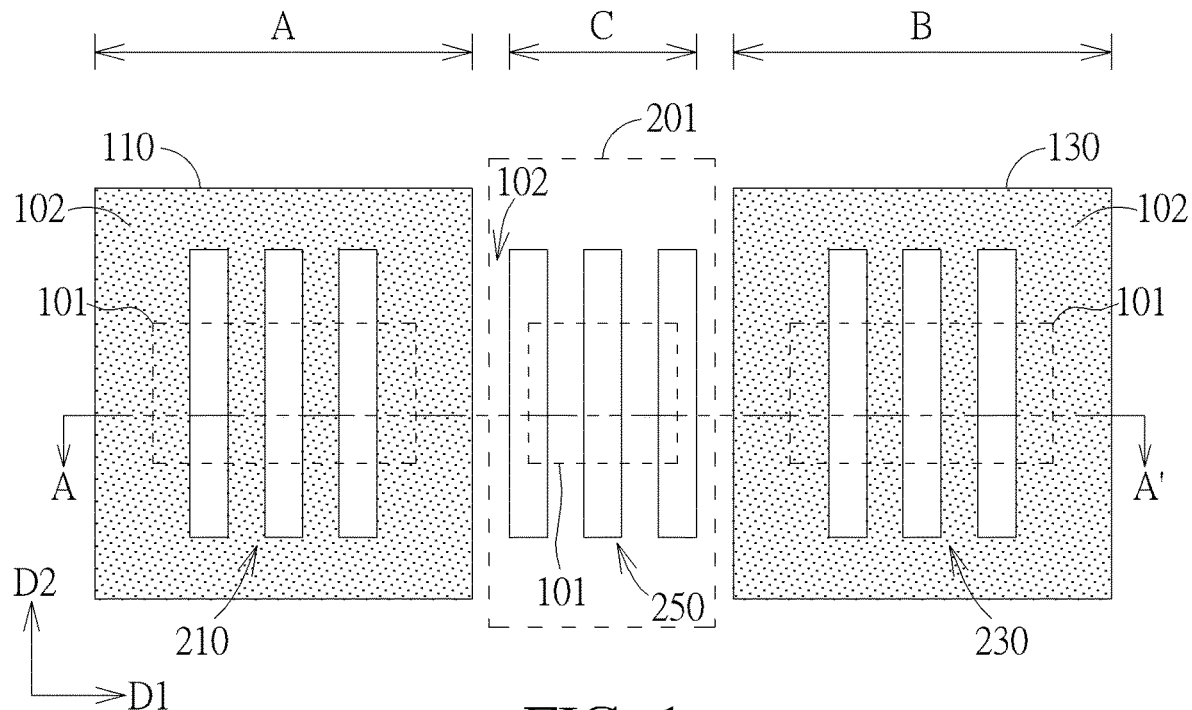
Figure 2:
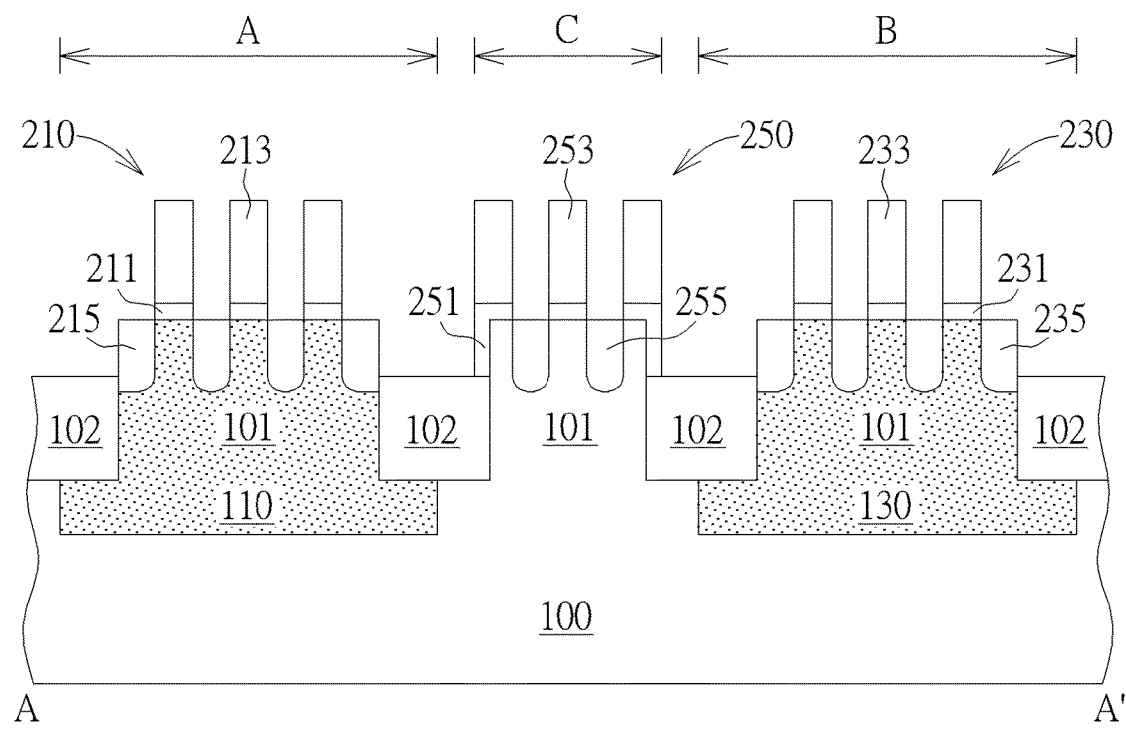

Please refers to FIGS. 1-2, which are schematic diagrams illustrating a structure of a semiconductor device according to the first embodiment of the present invention. First of all, a substrate 100 such as a semiconductor substrate like a silicon substrate, a silicon-containing substrate or a silicon-on-insulator (SOI) substrate is provided, and two wells 110, 130 are further disposed in the substrate 100 to respectively define two regions A, B and a region C between the two regions A, B within the substrate 100. In the present embodiment, the wells 110, 130 preferably include different conductive types such as P-type and N-type, but not limited thereto. In another embodiment, the two wells 110, 130 may optionally include the same conductive type, such as both being P-type or N-type.

Moreover, at least one fin 101 such as three fins as shown in FIG. 1 are formed in the substrate 100, the fins 101 are paralleled extended in serial, along a direction D1 (such as the x-direction) and a portion of the fins 101 are completely disposed within the regions A, B, as shown in FIG. 1. Although the present embodiment is exemplified by disposing the three fins 101 in the three different regions A, B, C respectively, the practical number and the dimension of fins 101 are not limited thereto. In other embodiments, one fin, more than one fins or fins with different dimensions may also be formed according to different product requirements, or the fins may also be omitted by directly forming a planar substrate (not shown in the drawings). The formation of the fins 101 may be accomplished by performing a general photolithography-etching process (PEP) process or a multi-patterning process. In the present embodiment, a spacer self-aligned double-patterning (SADP) namely a sidewall image transfer (SIT) technique is performed to firstly form at least one shallow trench (not shown in the drawings) in the substrate 100, and an insulating layer is formed in the at least one shallow trench to form a shallow trench isolation (STI) 102, and also to make the substrate 100 protruded from the shallow trench isolation 102 to form the fins 101, as shown in FIGS. 1-2.

Then, a plurality of gate structures 210, 230, 250 are disposed on the substrate 100, extended along a direction D2 (such as a y-direction) which is perpendicular to the direction D1, across the fins 101 disposed within the different regions A, B, C respectively, and source/drain regions 215, 235, 255 are formed in the fins 101 at two sides of the gate structures 210, 230, 250. In the present embodiment, each of the gate structures 210, 230, 250 includes a gate dielectric layer 211, 231, 251 such as including a material like silicon oxide or silicon nitride, and a gate 213, 233, 253 such as including a material like polysilicon or amorphous silicon, but is not limited thereto. Also, although the present embodiment is exemplified by disposing three gate structures 210, 230, 250 in the three different regions A, B, C respectively, the practical number and the dimension of the gate structures 210, 230, 250 are not limited thereto and may be further adjustable according to the product requirements.

It is noted that, a portion of the gate structures 250 disposed in the region C is formed to cross on sidewalls of the fins, so that, the gate structures 250 are partially disposed on the shallow trench isolation 102. With this arrangement, the gate structures 210, 230 disposed within the regions A, B may further in connection with an active element (not shown in the drawings) or an outer circuit (not shown in the drawings) via an interconnection system (not shown in the drawings) formed subsequently, thereby being functioned like a core region of the semiconductor device respectively, and the gate structures 250 disposed within the region C may form a dummy cell region 201 to isolate two adjacent core regions (namely, the regions A, B). In this way, the dummy cell region 20a is provided to efficiency isolate the two core regions, while maintaining the entire component density of the semiconductor device.

Accordingly, the dummy cell region 201 is additionally disposed between each core region (namely, the regions A, B) in the semiconductor device of the first preferred embodiment, and which includes the dummy disposed gate structures 250 and the fins 101 which is across by the gate structures 250, so as to sufficiency isolate each core region and to maintain the entire component density of the semiconductor device at the same time. However, as the trend in the electrical products as well as the semiconductor device has been scale down the size to increase the integration level and the high density, the dimensions and the disposed area of each element have meet more challenges and limits thereby. Thus, the disposed area of the dummy cell region 201 may be further shrunk under the aforementioned trend, so that, the practical arrangement of the semiconductor device may be also modified accordingly. In some situation, the dummy cell region 201 may be optionally disposed within the region A or the region B, to save the arranged area in the semiconductor device, and such disposition of the dummy cell region 201 may easily have a risk to lead to current leakage or uneven current issues at the boundaries of the region A or the region B. Accordingly, people in the art should easily understand the semiconductor device of the present invention is not limited to the aforementioned embodiment and may further include other embodiments, to meet the requirements of the practical products.

The following description will detail the different embodiments of the semiconductor device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 3:
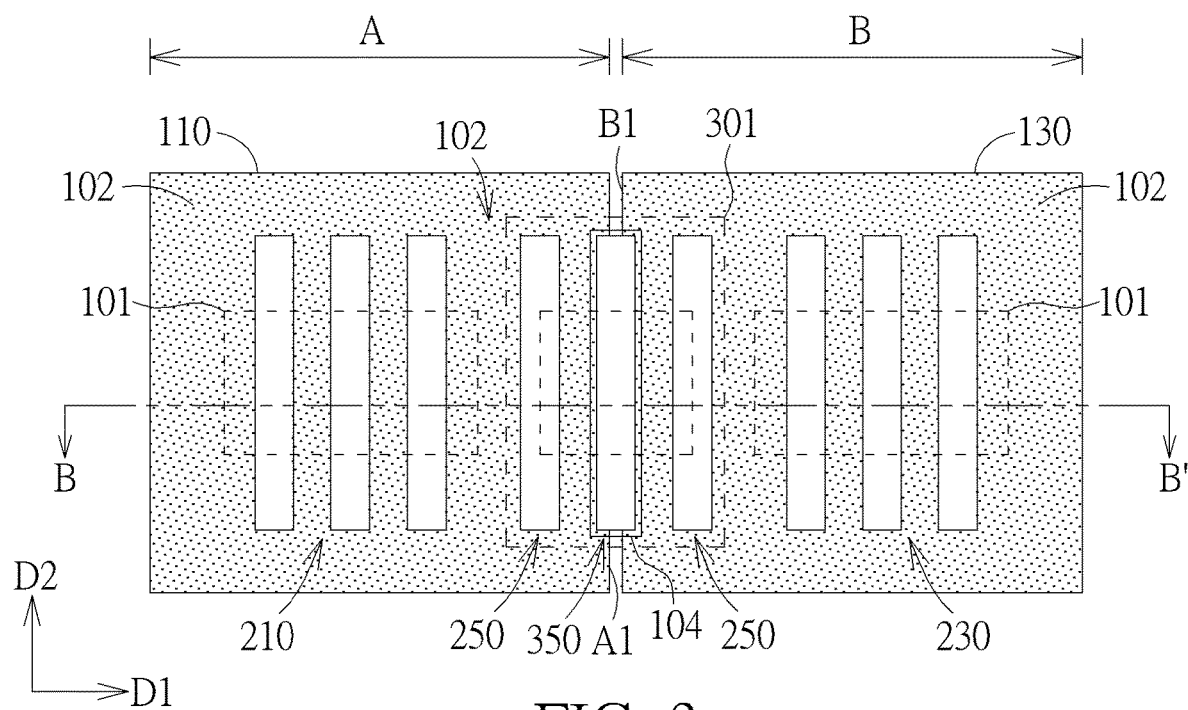
Figure 4:
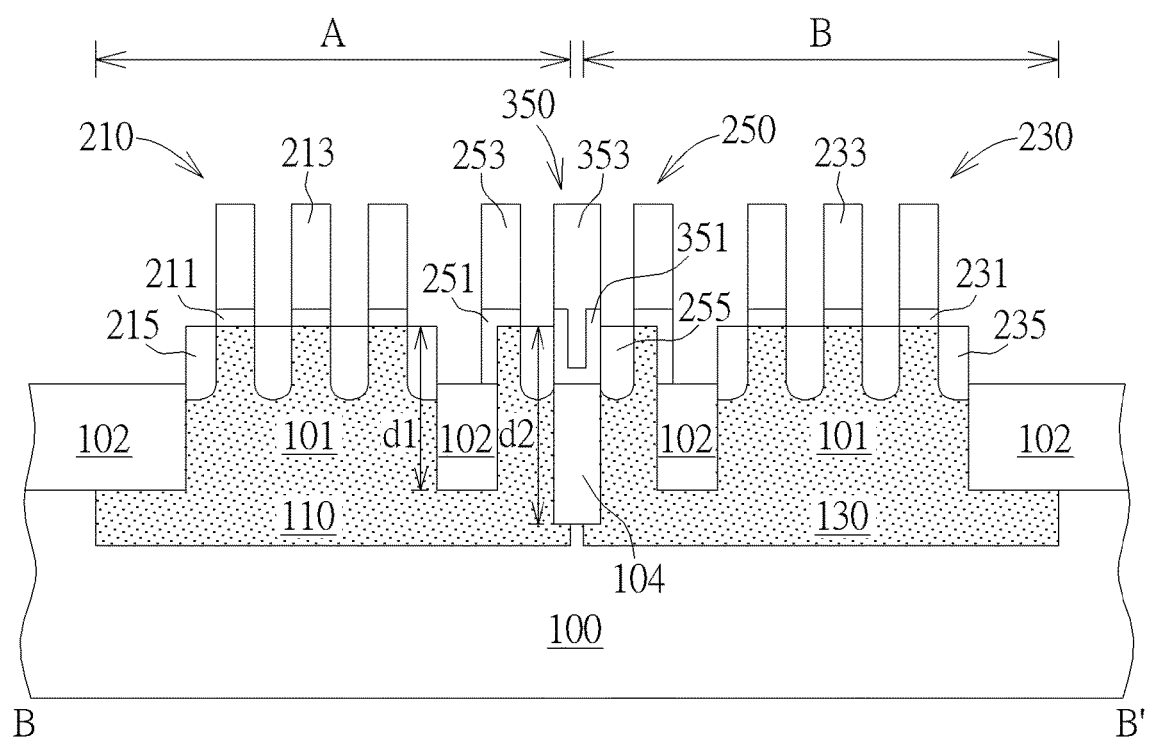

Please refers to FIGS. 3-4, which are schematic diagrams illustrating a structure of a semiconductor device according to the second embodiment of the present invention. The structure in the present embodiment are substantially similar to those in the aforementioned first preferred embodiment, such as including elements like the substrate 100, the fins 101, the shallow trench isolation 102 and the gate structures 210, 230, 250 which will not redundantly described herein after. The differences between the present embodiment and the aforementioned embodiment is mainly in that, a dummy cell region 301 of the present embodiment is partially overlapped with the regions A, B, and the dummy cell region 301 is directly disposed on the boundaries A1, B1 of the regions A, B, across the boundaries A1, B1.

Precisely speaking, the dummy cell region 301 of the present embodiment includes an isolation structure 104 additionally disposed on the boundaries A1, B1 of the regions A, B, with the isolation structure 104 being extended along the direction D2 to penetrate through the fins 101, as shown in FIGS. 3-4. It is noted that, the isolation structure 104 is directly across the boundaries A1, B1 of the regions A, B, to partially overlap with the well 110 of the region A and the well 130 of the region B. The isolation structure 104 preferably includes a length (not shown in the drawings) along the direction D2, which is greater than that of the fins 101, and the isolation structure 104 also includes a depth d2 which is greater than the depth d1 of the shallow trench isolation 102, for achieving a better isolation. In one embodiment, the formation of the isolation structure 104 is accomplished by etching the substrate 100 to form a deep trench (not shown in the drawings) in the substrate 100 after forming the shallow trench, followed by filling the deep trench with the insulating layer while forming the insulating layer in the shallow trench, to form the isolation structure 104 thereby. Through this performance, the isolation structure 104 and the shallow trench isolation 102 may both include top surfaces with the same height, as shown in FIG. 4. However, in another embodiment, a deep trench (not shown in the drawings) may also be formed by etching the shallow trench isolation 102 and fins 101 after forming the shallow trench isolation 102 and fins 101, and another insulating layer is then filled in the deep trench, to form an isolation structure (not shown in the drawings) in the another embodiment, with a top surface of the isolation structure being not coplanar with the top surface of the shallow trench isolation 102.

Figure 5:
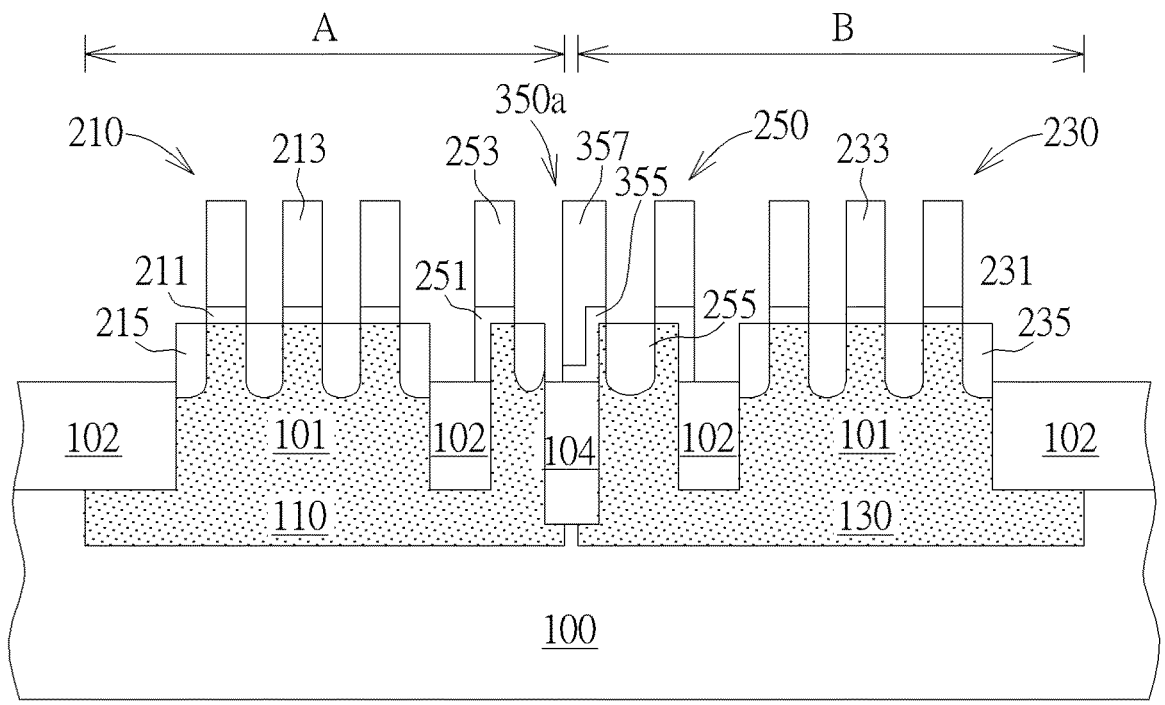
FIG. 5 is a schematic diagram illustrating a structure of a semiconductor device according to another preferred embodiment of the present invention.
Figure 6:
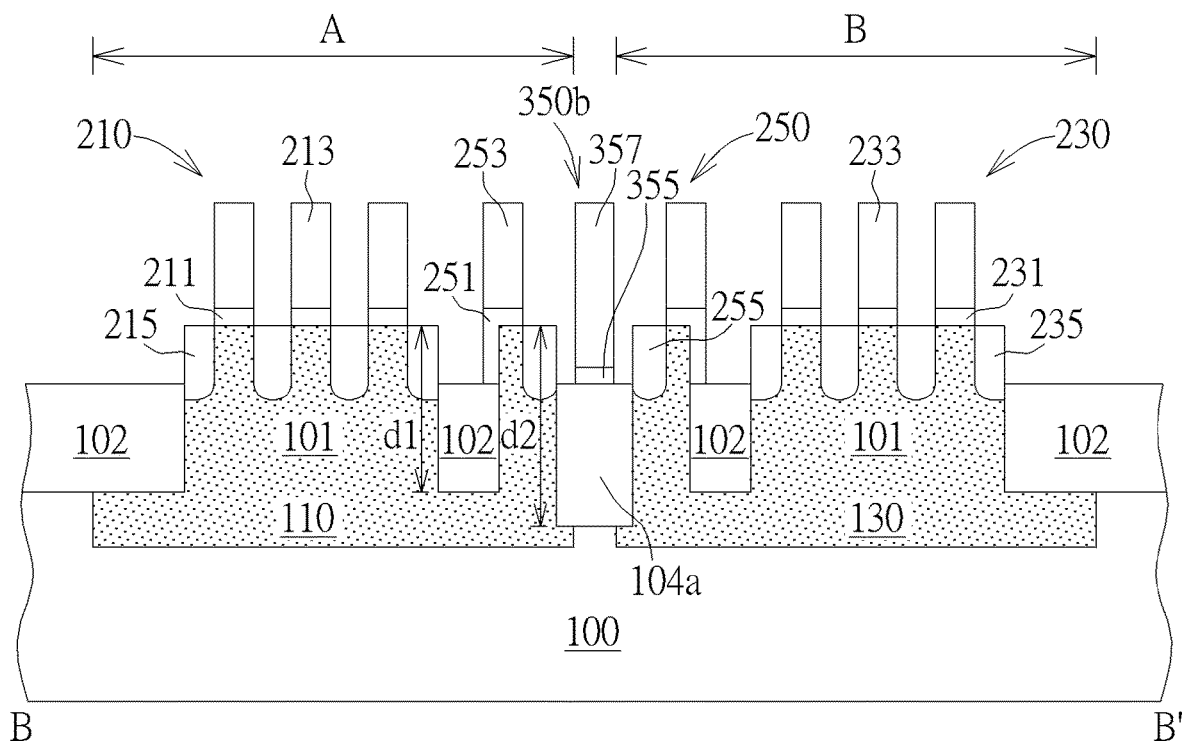
FIG. 6 is a schematic diagram illustrating a structure of a semiconductor device according to another preferred embodiment of the present invention.

Then, gate structures 250, 350 are disposed on the fins, and at least one gate structure 350 is overlapped with the isolation structure 104 underneath, to form the dummy cell region 301 of the present embodiment. It is noted that, since the isolation structure 104 is formed to penetrate through the fin 101, a relative lower top surface is obtained to the isolation structure 104. Accordingly, a lower part of the gate structure 350 (including a gate dielectric layer 351 and gate 353) may directly extend into the fin 101 to dispose on the isolation structure 104, as shown in FIG. 4. Also, although the gate structure 350 of the present embodiment is directly formed on the boundaries A1, B1 of the regions A, B, to completely overlap with the isolation structure 104 underneath, the practical arrangement thereof is not limited thereto. In another embodiment, the gate structure such as gate structures 350a, 350b may also be formed to only partially overlap with the isolation structure 104, as shown in FIGS. 5-6, for meeting the practical requirement of products. Under such arrangement, only a part of the gate structure 350a/350b (including a gate dielectric layer 355 and a gate 357) may extend into the fin 101 to dispose on the isolation structure 104/104a. In other word, in another embodiment, the gate structure 250a may only overlap with a right part (as shown in FIG. 5) or a left part of the isolation structure 104, while each of the gate structure 250, 350a still have the same pitch therebetween. In this way, the gate structure 350a may not dispose on both of the boundaries A1, B1 of the regions A, B at the same time. Otherwise, in another embodiment, a dimension (namely the size thereof) of the isolation structure 104a is greater than that of each of the gate structures 250, 350b, so that, the gate structure 350b may not completely cover the entire isolation structure 104a underneath, and the gate structure 350b may not dispose on the boundaries A1, B1 of the regions A, B, as shown in FIG. 6. Furthermore, in another embodiment, the pitch between each of the gate structures 250, 350 may be changed optionally, to form another gate structure (not shown in the drawings) which may not completely overlap with the isolation structure 104 underneath.

Figure 7:
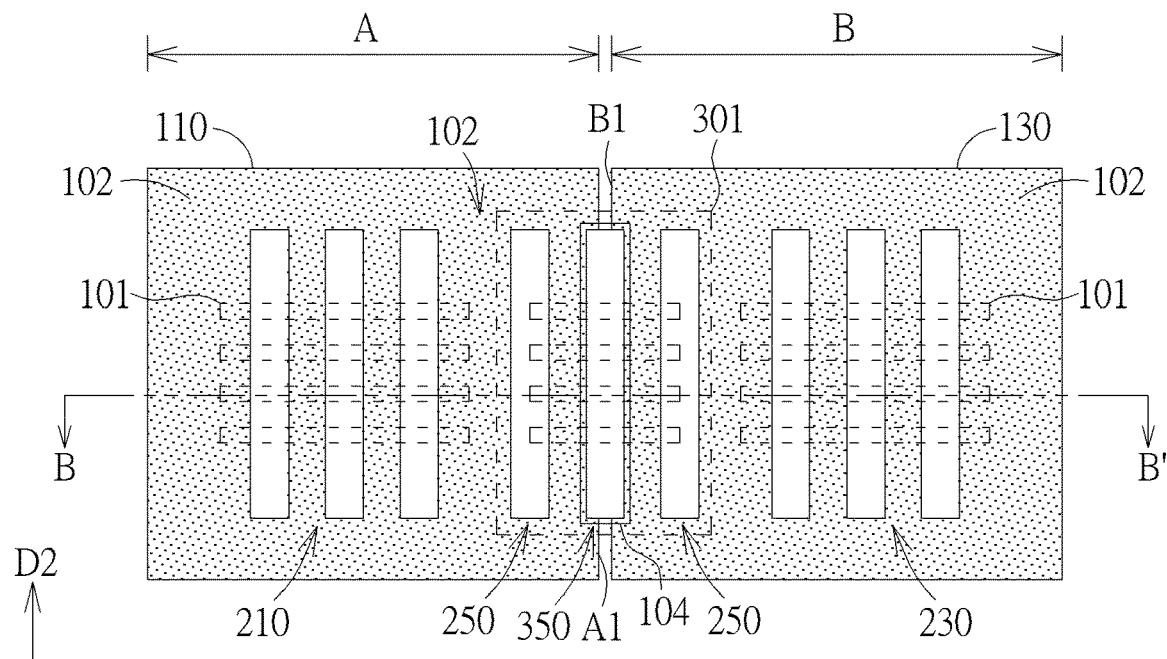
FIG. 7 is a schematic diagram illustrating a structure of a semiconductor device according to another preferred embodiment of the present invention.

Additionally, it is also noted that, although the present embodiment is exemplified by disposing the three fins 101 within the region A, within the region B and on the two adjacent boundaries A1, B1 of the regions A, B, respectively, the practical number and the dimension of fins 101 are not limited thereto. For example, in another embodiment, fins (not shown in the drawings) disposed within the region A, within the region B and on the two adjacent boundaries A1, B1 of the regions A, B, respectively, may include different dimensions, or a plurality of fins 101a may be formed within the region A, within the region B and on the two adjacent boundaries A1, B1 of the regions A, B, respectively, as shown in FIG. 7.

Based on the aforementioned arrangement, the dummy cell region 301 of the semiconductor device in the second preferred embodiment is disposed to partially overlap with each core region, and which includes the isolation structure 104 having a relative greater depth d2 than that of the shallow trench isolation 102, the dummy disposed gate structures 250, 350, and the fins 101 disposed under the gate structures 250, 350. Accordingly to the semiconductor device of the present embodiment, the disposing space of the dummy cell region 301 are sufficient reduced while maintaining the same component density, because the dummy cell region 301 is partially overlapped with each core region (namely, overlapping with the wells 110, 130). Also, since the isolation structure 104/104a of the dummy cell region 301 is directly disposed on the boundaries A1, B1 of two adjacent core regions, the aforementioned current leakage or unstable current issues possibly occurred at the boundaries A1, B1 of the core regions may be sufficiently avoided thereby, so as to improve the element performance of the semiconductor device. Besides, the size of each of the core region in the semiconductor device of the present embodiment may be further shrunk due to the disposition of the isolation structure 104. For example, through disposing an isolation structure at the boundaries of the wells 110, 130, two adjacent edges (namely the boundaries) of the wells 110, 130 may be directly in contact with each other optionally, to make the two regions A, B being directly abutted upon each other (not shown in the drawings), thereby further shrinking the dimension (size) of the semiconductor device.

Figure 8:
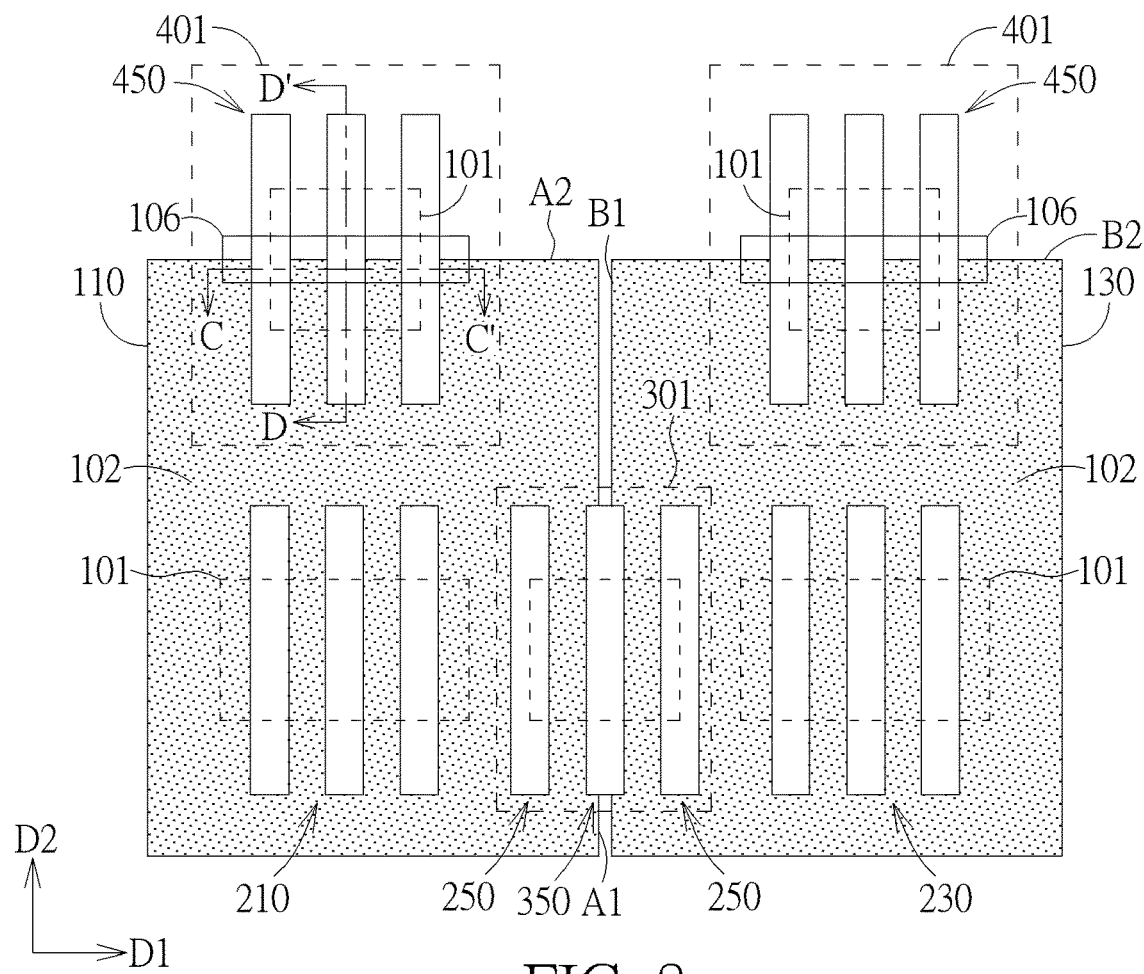
Figure 9:
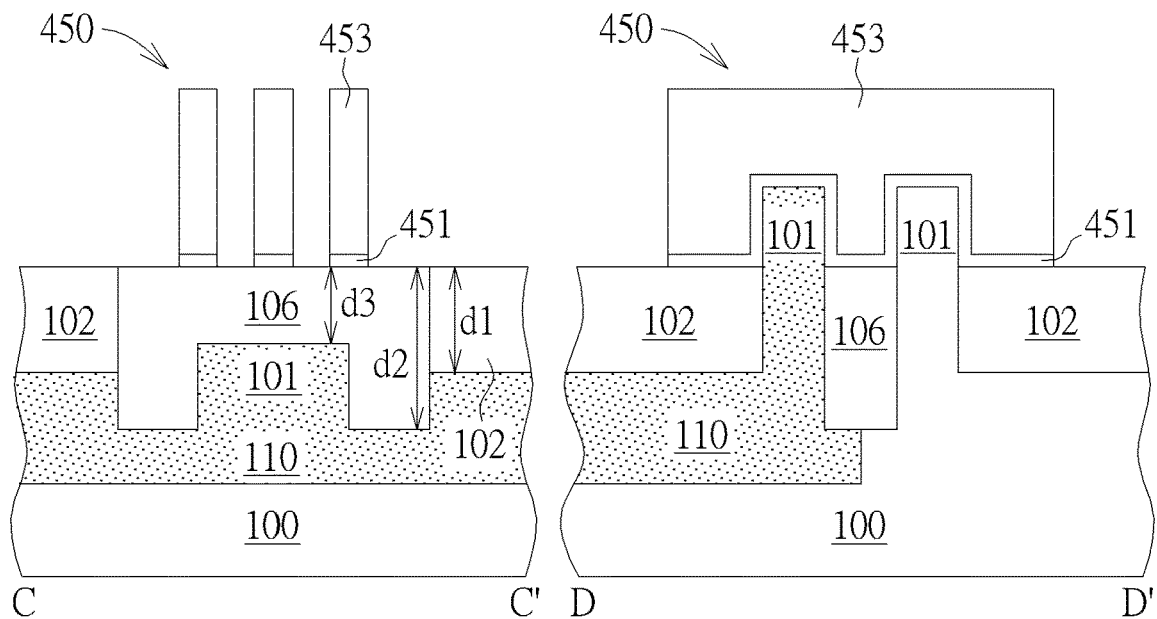

Please refers to FIGS. 8-9, which are schematic diagrams illustrating a structure of a semiconductor device according to the third embodiment of the present invention. The structure in the present embodiment are substantially similar to those in the aforementioned second preferred embodiment, such as including elements like the substrate 100, the fins 101, the shallow trench isolation 102 and the gate structures 210, 230, 250 which will not redundantly described herein after. The differences between the present embodiment and the aforementioned embodiment is mainly in that, dummy cell regions 301, 401 of the present embodiment are simultaneously disposed on boundaries A1, A2, B1, B2 of the regions A, B.

Precisely speaking, in the semiconductor device of the present embodiment, the isolation structures 104, 106 are respectively disposed both on two adjacent boundaries A1, B1 of the regions A, B and on another two boundaries A2, B2 of the regions A, B. The isolation structure 104 is extended along the direction D2 (namely the extending direction of the gate structures 210, 230, 450) to penetrate through the fin 101, and the isolation structure 106 is extended along the direction D1 (namely the extending direction of each fin 101) to stretch across the fin 101, as shown in FIGS. 8-9. The isolation structure 106 preferably includes a relative greater length (not shown in the drawings) in the direction D1, and a depth d2 being greater than the depth d1 of the shallow trench isolation 102, so as to achieve a better isolation. On the other hand, features of the isolation structure 104 are substantially the same as those in the aforementioned embodiments, and which may be redundantly described hereinafter.

It is noted that, the isolation structure 106 is formed by firstly etching the fin 101 in the direction D1 followed by filling the insulating layer, so that, the isolation structure 106 may obtain a relative higher bottom surface at the position where the fin 101 is originally disposed, thereby obtaining a relative smaller depth d3. Other parts of the isolation structure 106 may still have the same depth d2 as the isolation structure 104, being greater than that (depth d1) of the shallow trench isolation 102, as shown on the left of FIG. 9. Then, the gate structure 450 formed in the subsequent process is disposed on the fin 101 and the isolation structure 106, thereby forming the dummy cell region 401 of the present embodiment. It is also noted that, since a part of the fin 101 has been replaced by the isolation structure 106, the source/drain region may not be formed at two sides of a part of the gate structure 450, as shown on the left of FIG. 9. On the other hand, a lower part of the gate structure 450 (including a gate dielectric layer 451 and a gate 453) is directly extended into the fin 101, to dispose on the isolation structure 106, as shown on the right of FIG. 9.

Based on the aforementioned arrangement, the dummy cell regions 301, 401 of the semiconductor device in the third preferred embodiment are respectively disposed both on the two adjacent boundaries A1, B1 and on another two boundaries A2, B2 of the core regions (namely the regions A, B), to partially overlap with each core region. The dummy cell regions 301, 401 respectively include the isolation structure 104, 106 having a relative greater depth d2 than that of the shallow trench isolation 102, the dummy disposed gate structures 250, 350, 450 and the fins 101 disposed under the gate structures 250, 350, 450. Accordingly to the semiconductor device of the present embodiment, the disposing spaces of the dummy cell regions 301, 401 are also sufficiently reduced while maintaining the same component density, and also, the current leakage and unstable current issues possibly occurred at the boundaries A1, B1, A2, B2 of the core regions are sufficiently avoided thereby.

Figure 10:
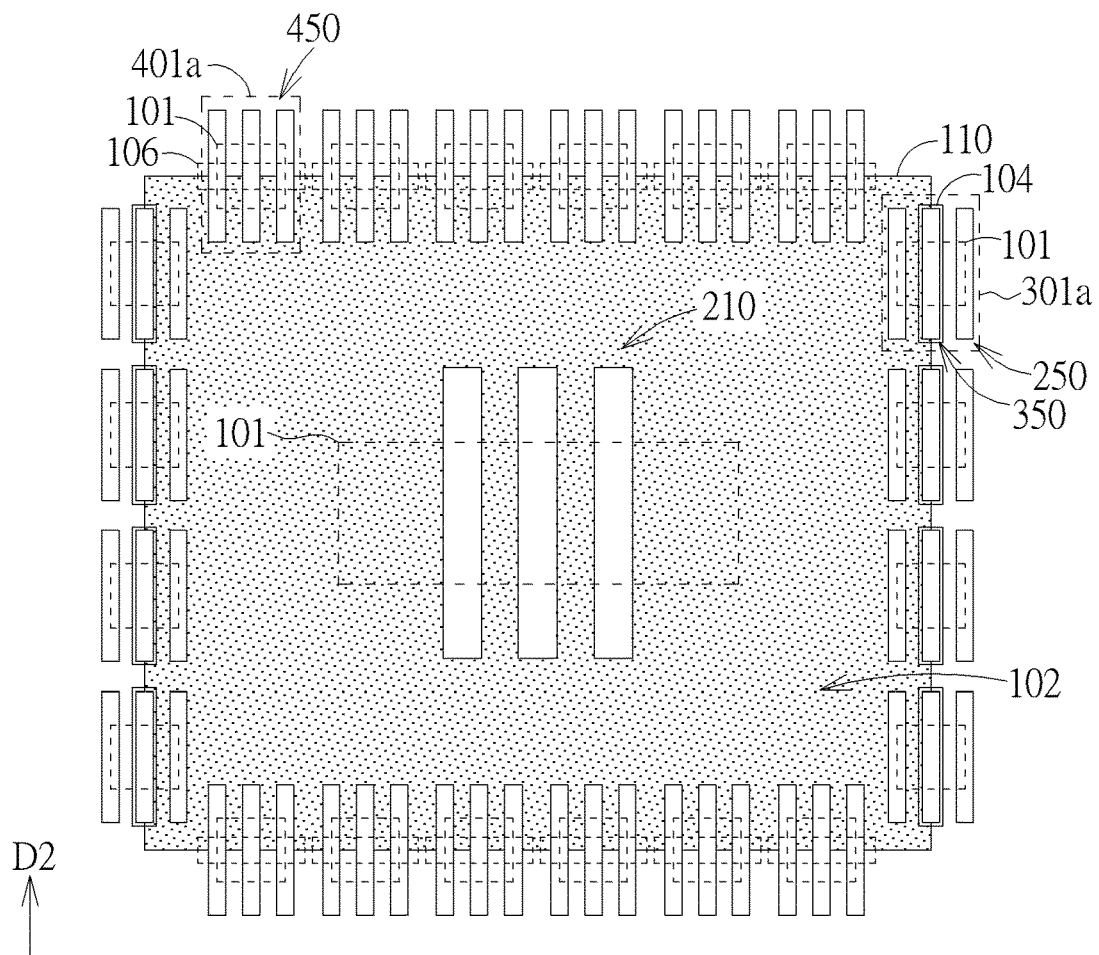
FIG. 10 is a schematic diagram illustrating a structure of a semiconductor device according to a fourth preferred embodiment of the present invention.

Moreover, although the dummy cell regions 301, 401 of the present embodiment is exemplified by respectively disposing one dummy cell regions 301 extended along the direction D2 on the boundaries A1, B1 also extended in the direction D2, and disposing one dummy cell regions 401 extended along the direction D1 on the boundaries A2, B2 which are also extended in the direction D1, the practical disposition and the number of the dummy cell region are not limited thereto and which may be further adjustable based on the product requirement. For example, the isolation structures 104, 106 and the gate structures 250, 350, 450 may also be formed on each boundary of the regions A, B, so as to form the dummy cell regions 301, 401 on each boundary of the regions A, B. Preferably, all of the isolation structures 104, 106 of the dummy cell regions 301, 401 together have a length in the corresponding direction, with the length being greater than the length of the fins 101 within the regions A, B, so as to effectively isolate the regions A, B for improving the element performance of the semiconductor device. Otherwise, in another embodiment, a plurality of dummy cell sub-regions 301a and a plurality of dummy cell sub-regions 401a are separately formed on each boundary of the region A (or the region B) respectively, with the structure of each of the dummy cell sub-regions 301a being substantially the same as that of the aforementioned dummy cell region 301, with the structure of each of the dummy cell sub-regions 401a being substantially the same as that of the aforementioned dummy cell region 401, and with an entire extending length of the dummy cell sub-regions 301a or the dummy cell sub-regions 401a being greater than the length of the fins 101 disposed within the region A (or the region B), as shown in FIG. 10. Thus, the regions A, B may also be isolated from each other effectively.

Figure 11:
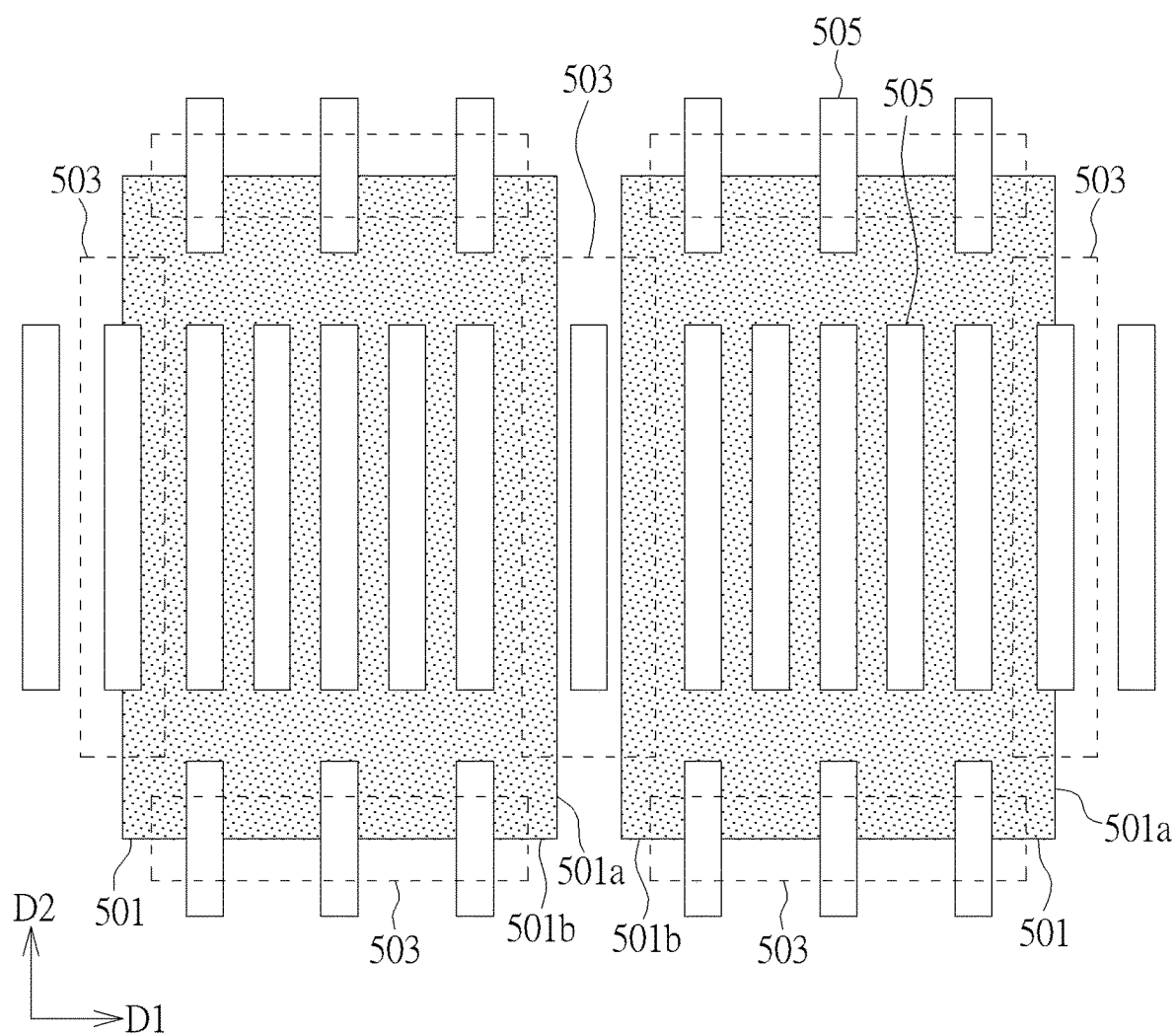
FIG. 11 is a schematic diagram illustrating a forming method of a semiconductor device according to a preferred embodiment of the present invention.

Furthermore, referring to the disposing relationship between the wells 110, 130 and the dummy cell regions 301, 401 (such as the isolation structures 104, 106), the formation of the semiconductor device in the present embodiment may be accomplished by firstly establishing a layout design as shown in FIG. 11 through an optical proximity correction (OPC) technique, to perform a preliminary correction. The optical proximity correction technique is for example carried out by using a storage medium (not shown in the drawings) of a computer system (not shown in the drawings) to adjust the matching of each element pattern, so as to facilitate the practical fabricating process of each element. For example, a plurality of layout patterns 501 is firstly established on the layout design, and which are separately disposed along the direction D2 as shown in FIG. 11, within the same dimension, but not limited thereto. In another embodiment, the layout patterns may optionally be formed by directly abutting with each other. Next, a plurality of layout patterns 503 is established, and which are optionally extended along the direction D1 or the direction D2, to overlap with at least one boundary 501a, 501b of each layout pattern 501 in the direction D1 or the direction D2. Preferably, each of the layout patterns 503 covers about 70% to 80% length of the boundary 501a, 501b, as shown in FIG. 11. Then, a plurality of layout patterns 505 is established, and which are parallel extended along the direction D2, to make a portion of the layout patterns 505 being completely dispose within the areas of the layout patterns 501. On the other hand, another portion of the layout patterns 505 is disposed outside the area of the layout patterns 501, to cross the layout patterns 503.

Following these, the forming process of the semiconductor device may be carried out based on the layout design as shown in FIG. 11. Firstly, a first photomask (not shown in the drawings) may be used to form the wells 110, 130 which are corresponding to the layout patterns 501 in the substrate 100 as shown in FIG. 8. Next, after forming the fins 101 and the shallow trench isolation 102, a second photomask (not shown in the drawings) is used to further form the isolation structures 104, 106 which as corresponding to the layout patterns 503 in the substrate 100. Then, a third photomask (not shown in the drawings) is used to form the gate structures 210, 230, 250, 350, 450 which are corresponding to the layout patterns 505 on the substrate 100, across the fins 101, the shallow trench isolation 102 and the isolation structures 104, 106 underneath, as shown in FIG. 8. Though this performance, the patterns, as well as the corresponding relationship, of the wells 110, 130, the isolation structure 104, 106 and the gate structures 210, 230, 250, 350, 450 are allowable to be adjusted in advance via the OPC technique, so as to make the exposure patterns to meet the expected requirements of products.

Overall speaking, the semiconductor device disposes at least one dummy cell region at a boundary of the core region, to make the dummy cell region to partially overlap with the core region. That is, the semiconductor device may enable to maintain a high component density while shrink the disposing space of the dummy cell region. Also, the dummy cell region includes an isolation structure which is additionally disposed on the boundary of the core region, across the boundary of the core region to partially overlap with the boundary of the core region, so that, the dummy cell region of the present invention may successfully avoid the current leakage and unstable current issues generally occurred at the boundary of the core region. The isolation structure preferably extended in a length which is relative greater than the length of a main component (such as the fins 101) within the core region, for achieving a better isolation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate, having a plurality of fins disposed in the substrate, the fins being extended along a first direction;
a first well disposed in the substrate; and
a first dummy cell region, disposed at a first boundary of the first well, the first dummy cell region comprising:
one of the plurality of fins disposed within the first dummy cell region;
a first isolation structure disposed in the substrate, along a second direction being perpendicular to the first direction to penetrate through one of the plurality of fins disposed within the first dummy cell region; and
a plurality of first gate structures disposed on the first isolation structure.

2. The semiconductor device according to claim 1, wherein one of the first gate structures is disposed on the first boundary of the first well.

3. The semiconductor device according to claim 2, wherein the one of the first gate structures is partially overlapped with the first isolation structure.

4. The semiconductor device according to claim 2, wherein another one of the first gate structures is disposed within the first well.

5. The semiconductor device according to claim 2, further comprising:
a second well disposed in the substrate, and the first dummy cell region being disposed between the first well and the second well.

6. The semiconductor device according to claim 5, wherein the one of the first gate structures is also disposed on a second boundary of the second well.

7. The semiconductor device according to claim 5, wherein another one of the first gate structures is disposed within the second well.

8. The semiconductor device according to claim 5, further comprising:
a second dummy cell region, disposed at a third boundary of the first well, the second dummy cell region comprising:
a second isolation structure disposed in the substrate, along the first direction to stretch across another one of the fins; and
a plurality of second gate structures disposed on the second isolation structure.

9. The semiconductor device according to claim 1, wherein the first dummy cell region further comprises a plurality of first dummy cell sub-regions, and each of the first dummy cell sub-regions is separated from each other and comprises:
an isolation structure disposed in the substrate, along the second direction; and
a plurality of gate structures disposed on the isolation structure.

10. The semiconductor device according to claim 8, wherein the second dummy cell region further comprises a plurality of second dummy cell sub-regions, and each of the second dummy cell sub-regions is separated from each other and comprises:
an isolation structure disposed in the substrate, along the first direction; and
a plurality of gate structures disposed on the isolation structure.

11. The semiconductor device according to claim 8, wherein the second gate structures are disposed on a third boundary of the second well.

12. The semiconductor device according to claim 11, wherein one of the second gate structures is at least partially overlapped with the second isolation structure.

13. The semiconductor device according to claim 1, wherein the substrate further comprises a shallow trench isolation surrounding the fins, and a depth of the shallow trench isolation is smaller than a depth of the first isolation structure.

14. A method of forming a semiconductor device, comprising:
providing a substrate;
using a first layout pattern to form a first well in the substrate, wherein a first dummy cell region is disposed at a first boundary of the first well;
forming a plurality of fins on the substrate, where one of the plurality of fins is disposed within the first dummy cell region;
using a second layout pattern to form a first isolation structure and a second isolation structure in the substrate, wherein the first isolation structure overlaps the first boundary of the first well in a first direction, and the second isolation structure overlaps a second boundary of the first well in a second direction being perpendicular to the first direction, wherein the first isolation structure penetrates through one of the plurality of fins within the dummy cell region; and
using a third layout pattern to form a plurality of gate structures along the first direction on the substrate.

15. The method of forming a semiconductor device according to claim 14, wherein one of the gate structures overlaps the first isolation structure, and the one of the gate structures overlaps the first boundary of the first well.

16. The method of forming a semiconductor device according to claim 15, wherein another one of the gate structures completely overlaps the first well.

17. The method of forming a semiconductor device according to claim 15, further comprising:
using the first layout pattern to form a second well in the substrate, the second well adjacent to the first well.

18. The method of forming a semiconductor device according to claim 17, wherein the one of the gate structures overlaps a third boundary of the second well, along the first direction.

19. The method of forming a semiconductor device according to claim 17, wherein another one of the gate structures completely overlaps the second well.

20. The method of forming a semiconductor device according to claim 14, further comprising:
forming a shallow trench isolation in the substrate, and a depth of the shallow trench isolation is smaller than a depth of the first isolation structure and the second isolation structure.

* * * * *